(12) United States Patent
Clifton et al.

(10) Patent No.: US 8,904,736 B2
(45) Date of Patent: Dec. 9, 2014

(54) VEHICLE AND MAST MOUNTING ASSEMBLY THEREFOR

(71) Applicants: Christopher Clifton, Bloomfield, IN (US); Dean L. Jones, Bloomington, IN (US); Philip S. Mitchell, Springville, IN (US); David Myers, Bloomfield, IN (US); James M. Pruett, Montgomery, IN (US)

(72) Inventors: Christopher Clifton, Bloomfield, IN (US); Dean L. Jones, Bloomington, IN (US); Philip S. Mitchell, Springville, IN (US); David Myers, Bloomfield, IN (US); James M. Pruett, Montgomery, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/623,561

(22) Filed: Sep. 20, 2012

(65) Prior Publication Data

US 2013/0025112 A1 Jan. 31, 2013

Related U.S. Application Data

(62) Division of application No. 12/696,856, filed on Jan. 29, 2010, now Pat. No. 8,276,325.

(51) Int. Cl.
*B23P 11/00* (2006.01)
*H05K 5/00* (2006.01)
*H01Q 1/12* (2006.01)

(52) U.S. Cl.
CPC ........... *H05K 5/0004* (2013.01); *H01Q 1/1235* (2013.01)

USPC .............. 52/745.17; 52/110; 52/118; 52/116; 248/540; 343/713; 343/883

(58) Field of Classification Search
CPC .................................. H01Q 1/084; H01Q 1/10
USPC .............. 52/110, 111, 116–118, 143, 745.17; 248/230.1, 230.4, 539, 540, 157; 343/713, 882, 883, 901; 29/525.01–525.03, 525.11, 525.13
See application file for complete search history.

(56) References Cited

U.S. PATENT DOCUMENTS

| | | | |
|---|---|---|---|
| 1,905,434 A * | 4/1933 | Boyer | 414/328 |
| 2,128,712 A | 8/1938 | Judson | |
| 2,541,970 A | 2/1951 | Pospisil | |
| 2,611,580 A | 9/1952 | Troche et al. | |
| 3,134,978 A * | 5/1964 | Arvay, Jr. | 343/709 |

(Continued)

FOREIGN PATENT DOCUMENTS

GB 1 246 538 9/1971

OTHER PUBLICATIONS

Antenna Products PM Mast Series—"Telescopic Masts", retrieved from: http://www.antennaproducts.com/telmasts.pdf., pp. 42 and 43. Mineral Wells, TXknown.

(Continued)

*Primary Examiner* — Robert Canfield
*Assistant Examiner* — Charissa Ahmad
(74) *Attorney, Agent, or Firm* — Christopher A. Monsey

(57) ABSTRACT

A vehicle is disclosed having a mast assembly mounted to a sidewall of the vehicle. The mast is pivotally mounted and can be held in a first stowed position by way of a first clamp member. The mast is pivotal relative to the sidewall, to an essentially vertical and erect position, and held in the second position by way of a second clamp.

13 Claims, 12 Drawing Sheets

(56) References Cited

U.S. PATENT DOCUMENTS

| | | | |
|---|---|---|---|
| 3,357,663 A * | 12/1967 | Ivy | 248/539 |
| 3,382,950 A * | 5/1968 | Sawyer | 185/37 |
| 3,521,285 A * | 7/1970 | Mautner | 343/709 |
| 3,858,091 A | 12/1974 | Wilkinson | |
| 3,960,353 A | 6/1976 | Leutwyler | |
| 4,038,661 A * | 7/1977 | Nolte | 343/715 |
| 4,101,897 A * | 7/1978 | Morrison | 343/715 |
| 4,249,351 A * | 2/1981 | Brock | 52/64 |
| 4,460,895 A | 7/1984 | Bert et al. | |
| 4,496,057 A | 1/1985 | Zenitani et al. | |
| 4,497,411 A | 2/1985 | DeBortoli | |
| 4,606,155 A * | 8/1986 | Bukovitz et al. | 52/116 |
| 4,687,168 A * | 8/1987 | Rupp | 248/539 |
| 4,746,263 A | 5/1988 | Cook | |
| 4,792,881 A | 12/1988 | Wilson et al. | |
| 4,802,008 A | 1/1989 | Walling | |
| 4,815,757 A | 3/1989 | Hamilton | |
| 4,871,103 A | 10/1989 | Martinsson | |
| 4,932,176 A | 6/1990 | Roberts et al. | |
| 4,958,167 A | 9/1990 | Schroeder | |
| 5,070,429 A | 12/1991 | Skirpan | |
| 5,229,925 A | 7/1993 | Spencer et al. | |
| 5,239,129 A | 8/1993 | Ehrenfels | |
| 5,252,985 A | 10/1993 | Christinsin | |
| 5,272,279 A | 12/1993 | Filshie | |
| 5,328,260 A | 7/1994 | Beirise | |
| 5,366,071 A | 11/1994 | Laszlo | |
| 5,445,355 A * | 8/1995 | Chen | 248/514 |
| 5,572,837 A | 11/1996 | Featherstone et al. | |
| 5,615,855 A | 4/1997 | Marue et al. | |
| 5,683,001 A | 11/1997 | Masuda et al. | |
| 5,721,394 A | 2/1998 | Mulks | |
| 5,743,635 A | 4/1998 | Hulse et al. | |
| 5,778,612 A | 7/1998 | Kissinger et al. | |
| 5,794,794 A | 8/1998 | Hull | |
| 5,819,956 A | 10/1998 | Rinderer | |
| 5,921,402 A | 7/1999 | Magenheimer | |
| 6,152,048 A | 11/2000 | Vander Park | |
| 6,201,687 B1 | 3/2001 | Murray | |
| 6,253,502 B1 | 7/2001 | Layton | |
| 6,260,310 B1 | 7/2001 | Price et al. | |
| 6,347,963 B1 | 2/2002 | Falkenberg et al. | |
| 6,466,431 B1 | 10/2002 | Thomas | |
| 6,497,442 B1 | 12/2002 | Wacker | |
| 6,546,677 B1 | 4/2003 | Featherstone | |
| 6,796,438 B2 | 9/2004 | Mendoza | |
| 6,964,463 B1 | 11/2005 | Hindle et al. | |
| 7,000,357 B1 | 2/2006 | Stearns et al. | |
| 7,017,760 B2 | 3/2006 | Zuclich et al. | |
| 7,045,706 B1 | 5/2006 | Lincoln, III et al. | |
| 7,080,865 B2 | 7/2006 | Bergeron et al. | |
| 7,265,292 B2 | 9/2007 | Greenfield | |
| 7,462,777 B2 | 12/2008 | Dinh | |
| 2001/0015707 A1 | 8/2001 | Oby | |
| 2002/0023990 A1 | 2/2002 | Heath | |
| 2002/0196195 A1 | 12/2002 | Vermette et al. | |
| 2004/0065796 A1 | 4/2004 | Evans et al. | |
| 2007/0102180 A1 | 5/2007 | Brosig-Rodriguez et al. | |
| 2008/0258931 A1 | 10/2008 | Christensen et al. | |
| 2009/0284963 A1 * | 11/2009 | Intravatola | 362/190 |

OTHER PUBLICATIONS

ArmyProperty.com, "Quick Erect Antenna Mast System (QEAM)," retrieved from http://www.armyproperty.com/Equipment-Info/QEAM.htm on Nov. 2, 2009, 4 pgs.

Clark Masts Fast Erecting Mast Systems, "Mast Mounting," retrieved from http://www.clarkmasts.com/mast_mounting.php on Oct. 31, 2009, 1 pg.

Floatograph Technologies, "Commercial Telescoping Masts," © 2008 retrieved from http://www.telescopingmast.com on Nov. 2, 2009, 24 pgs.

Trival Antene d.o.o., "Telecopic Winch Driven Masts STV," retrieved from http://www.trival-antennas-masts.com, 4 pgs., Kamnik, Solvenia.

Wenzlau Engineering, "Will-Burt Quick Erecting Antenna Masts," retrieved from http://www.wenzlau.com/masts-qeam.htm on Oct. 31, 2009, 2 pgs., Pasadena, CA.

The Will-Burt Company, "Mast Installation Guide for External Mounting," at least as early as Nov. 2, 2009, p. 1, sheet 412 and p. 18.

* cited by examiner

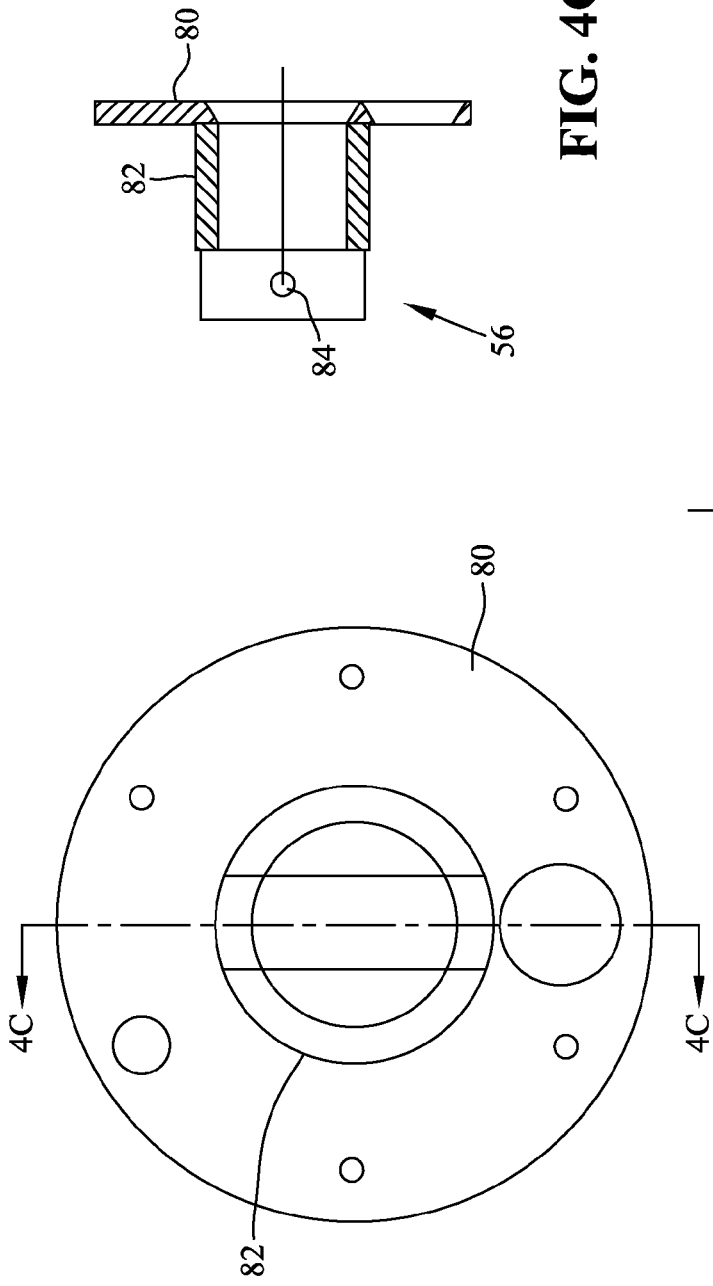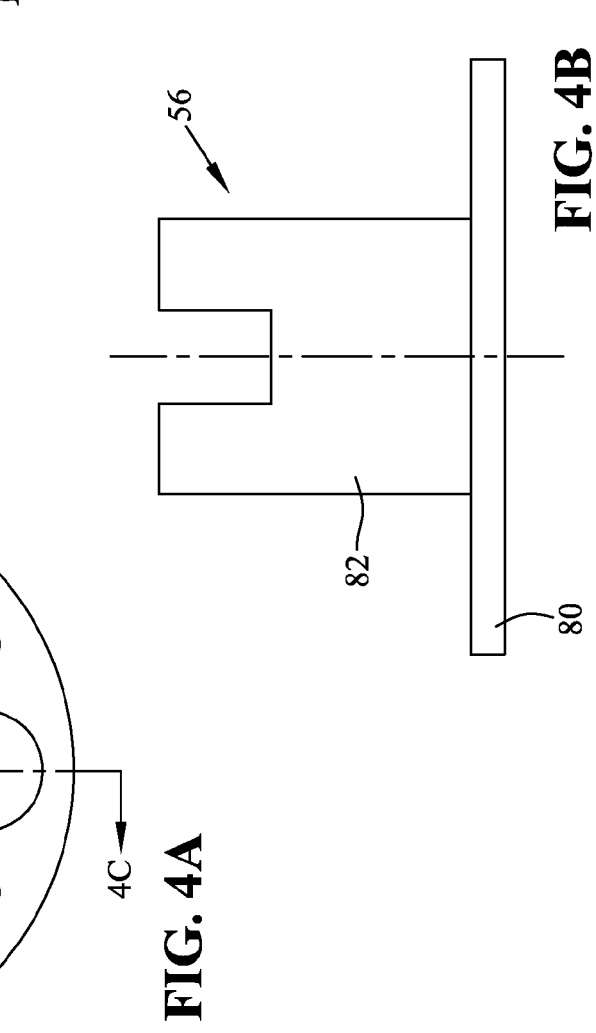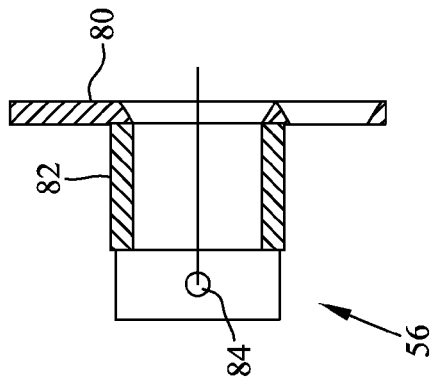

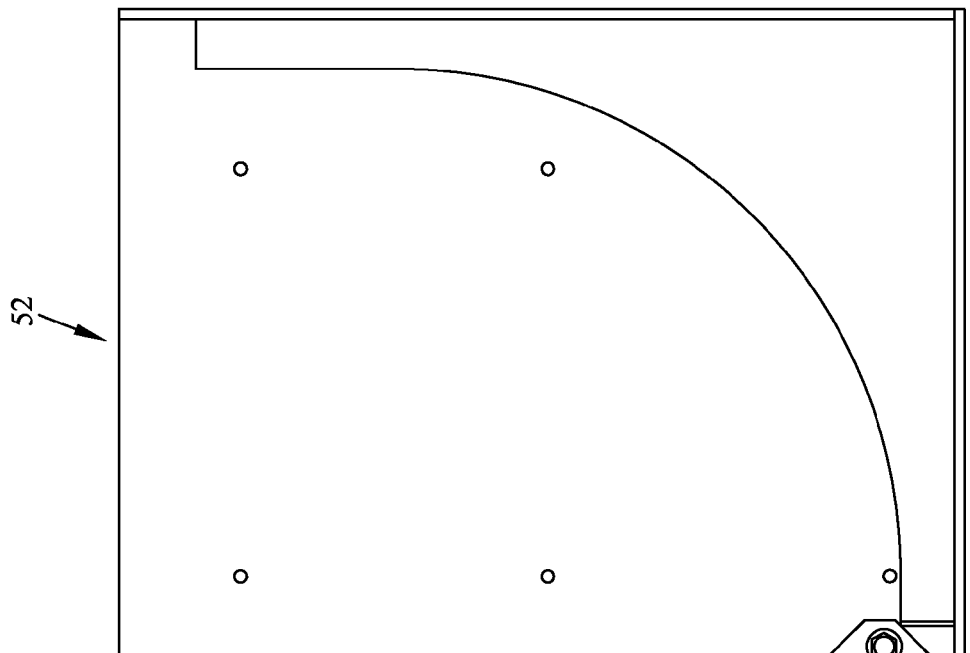
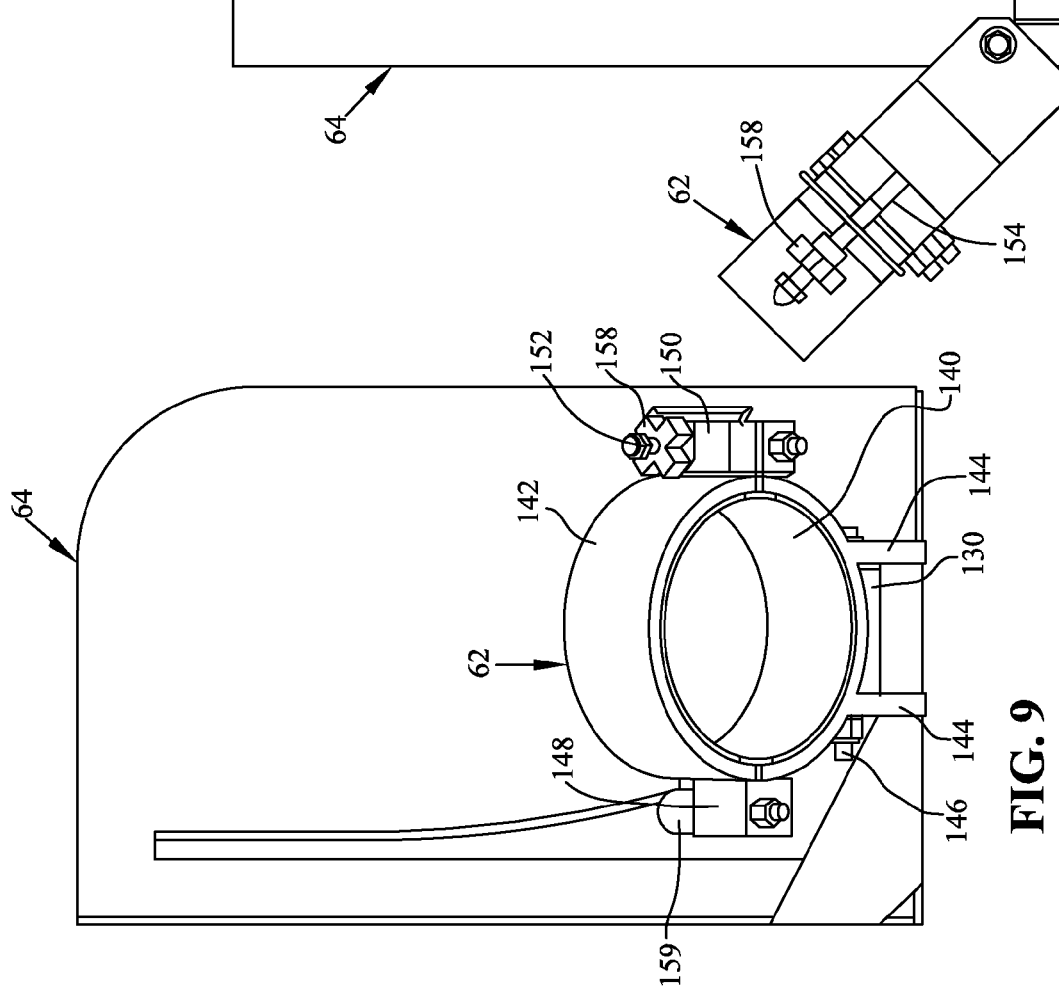

VEHICLE AND MAST MOUNTING ASSEMBLY THEREFOR

CROSS-REFERENCE TO RELATED APPLICATIONS

The present divisional application claims priority to U.S. patent application Ser. No. 12/696,856, filed Jan. 29, 2010, entitled "VEHICLE AND MAST MOUNTING ASSEMBLY THEREFOR," which claims priority to U.S. Provisional Patent Application Ser. No. 61/291,694, filed Dec. 31, 2009, entitled "VEHICLE AND MAST MOUNTING ASSEMBLY THEREFOR," the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND OF THE INVENTION

Oftentimes it is necessary in the commercial and military communications field to carry antenna masts for the use of receiving radio frequency signals. These masts are generally telescopic and can be either standalone or vehicle mounted.

The standalone masts can be carried in bags and removed at the point of use and manually erected, having guy wires for maintaining the mast in an upright position. Typically, the vehicle mounted masts are also held by guy wires, as the masts are telescopically extendable from a collapsed length of 8-10 feet to an erected height of 20-100 feet.

The vehicle mounted masts tend to be cumbersome and raise the vehicle height or weight substantially. In the case of military vehicles, both height (vertical clearance) and weight are important as oftentimes, the entire vehicles are shipped via aircraft.

SUMMARY OF THE INVENTION

In one embodiment, a mast assembly comprises a mast having a pivot end and an extendable end; a pivot connection assembly for attachment to the mast pivot end; a first clamp assembly for clamping retention of the mast in a stowed position; and a second clamp assembly for clamping retention of the mast in an erect position.

The assembly could be wall mounted where the pivot connection assembly pivotally attaches the mast to the wall; and the first and second clamp assemblies are also attached to the wall. The assembly could also be in the form of a mast mounting assembly, comprising a pivot connection assembly for a mast, the pivot connection member comprising a first portion fixable to a structure, a second portion fixable to a mast, and a pivot section interconnecting the first and second portions; a first clamp member for retention of the mast in a stowed position; and a second clamp member for retention of the mast in an erect position. The assembly could also be attached to a vehicle, where the vehicle has a frame; ground engaging members supporting the frame; and a propulsion mechanism for propelling the ground engaging members. The wall could be a vehicle sidewall. A method of making a transportable mast and a method of erecting a transportable mast are also described herein.

BRIEF DESCRIPTION OF THE DRAWINGS

FIG. 4A shows a top view of the pivot member for attachment to the mast;
FIG. 4B shows a side view of the pivot member of FIG. 4A;
FIG. 4C shows a cross-sectional view of the pivot member through lines 4C-4C of FIG. 4A;
FIG. 8 shows a front view of the clamp assembly of FIG. 7;
FIG. 9 shows an end view of the clamp assembly of FIG. 7.

DETAILED DESCRIPTION OF THE EMBODIMENT

Figure 1:
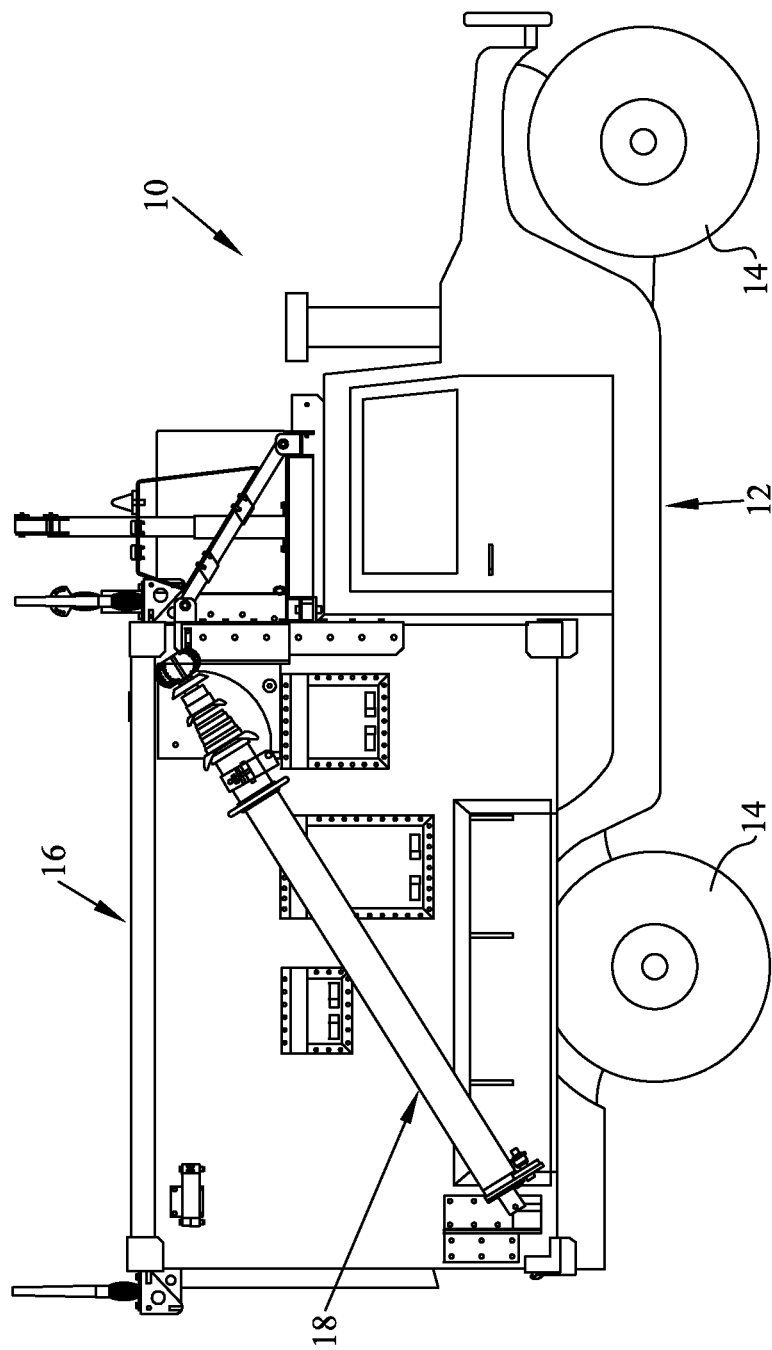
FIG. 1 is a side view of the vehicle of the present disclosure.

With reference first to FIG. 1, a vehicle 10 is disclosed which as disclosed is depicted as a truck, and more particularly as a military vehicle. It should be understood that the disclosure is equally applicable to commercial vehicles for use, for example, in radio or TV broadcasting or in any other application in which an extendable mast is used.

As shown, vehicle 10 comprises a frame 12, and ground engaging members 14 which support the frame 12. As depicted, the ground engaging members are shown as tires and wheels, however it should be understood that other ground engaging members such as tracks or skis could be employed. The invention is equally applicable to any water flotation devices. As shown, a shelter assembly 16 is supported by the vehicle frame 12 and includes a mast assembly 18 which will be described in greater detail herein.

Figure 2:
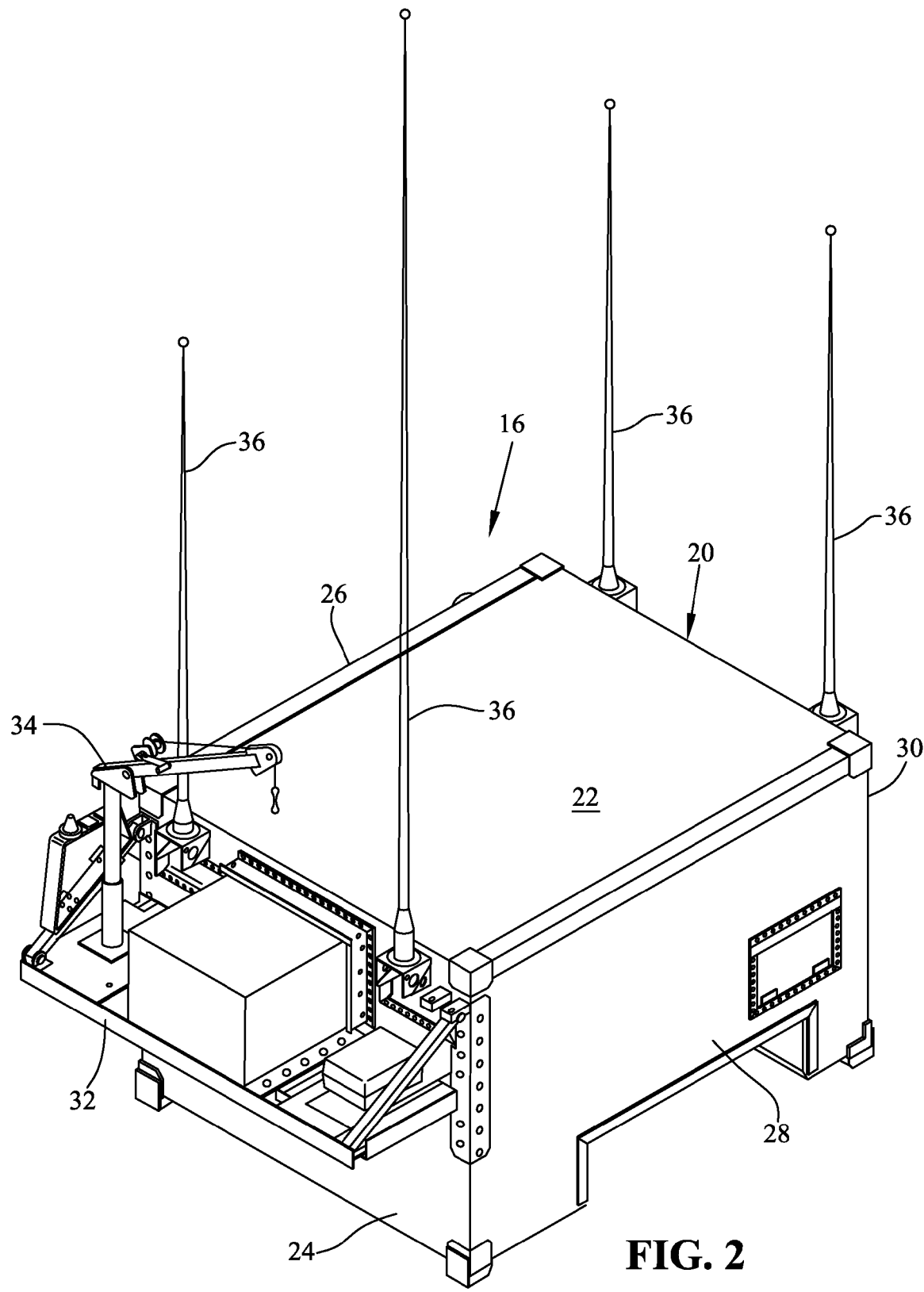
FIG. 2 is a front left perspective view of the shelter carried by the vehicle of FIG. 1.
Figure 3:
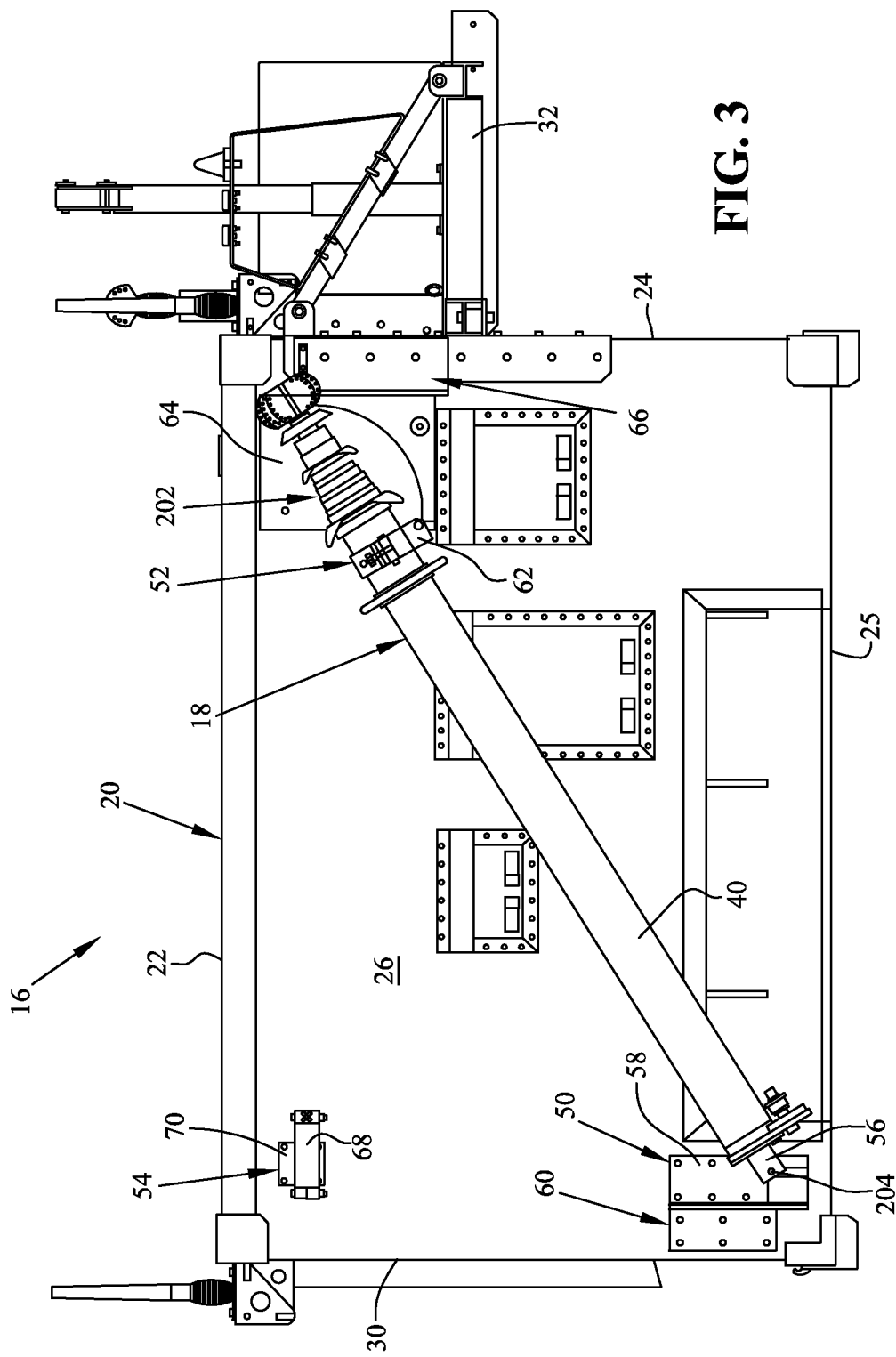
FIG. 3 is a right side view of the shelter shown in FIG. 2 showing the mast in the stowed position.

With respect now to FIGS. 2 and 3, shelter assembly 16 is shown in greater detail. Shelter assembly 16 includes an enclosure 20 having a top wall 22, a front wall 24, lower edge 25 (FIG. 3), side walls 26, 28 and rear wall 30. Shelter assembly 16 could also include a front work platform 32 including a hoist 34, as well as a plurality of antennas positioned around enclosure 20 and shown generally at 36.

As shown best in FIG. 3, mast assembly 18 is comprised of a mast 40 as well as a mast mounting assembly. Mast mounting assembly is comprised of pivot connection assembly 50, a first connection assembly 52 and a second connection assembly 54. First connection assembly 52 and second connection assembly 54 are in the form of clamp assemblies as described herein.

Pivot connection assembly 50 includes a pivot mount member 56, fixed to the bottom of the mast 40, and a bracket member 58, to which the pivot mount member rotates, as described herein. A backup bracket 60 is positioned against bracket member 58 as described herein. Connection assembly 52 is defined as a clamp assembly including a clamp 62 and a bracket 64. A backup bracket 66 is positioned against bracket 64 as described herein. Connection assembly 54 is defined as a clamp assembly including a clamp member 68 and a bracket member 70.

With respect now to FIGS. 4A-4C, pivot mount member 56 includes a flange 80 for attachment to the end of mast 40 and a cylindrical extension portion 82 for connection to pivot bracket 50. Extension portion 82 includes apertures such as 84 for receiving a fastener as described herein.

Figure 5:
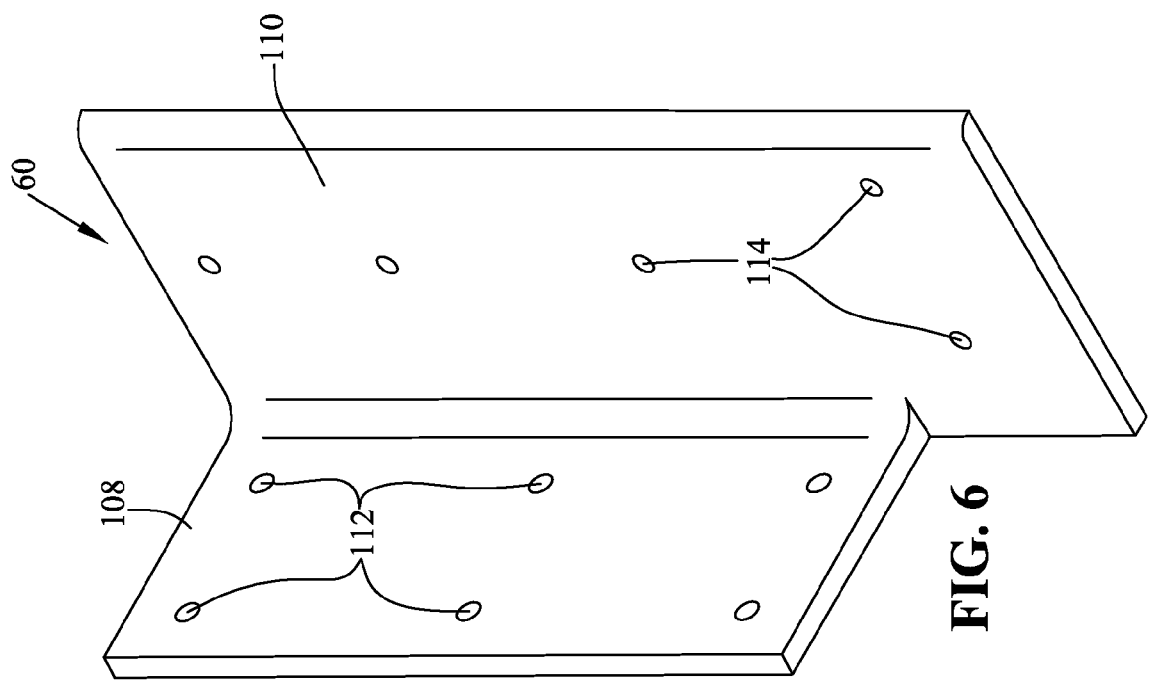
FIG. 5 shows the bracket member of the pivot connection assembly.

As shown in FIG. 5, bracket 58 includes a back wall 90, side wall 92 and lower wall 94. Back wall 90 includes a plurality of apertures 96 for connection to side wall 26 (FIG. 3) and side wall 92 includes a plurality of apertures 98 for connection to backup bracket 60. Bracket 58 further comprises a pivot block 100 upstanding from lower wall 94 and spaced apart from side wall 92 by way of a spacer rib 102. Pivot block 100 includes an aperture 104 for alignment with aperture 84 (FIG. 4C) of pivot member 56, as described herein.

Figure 6:
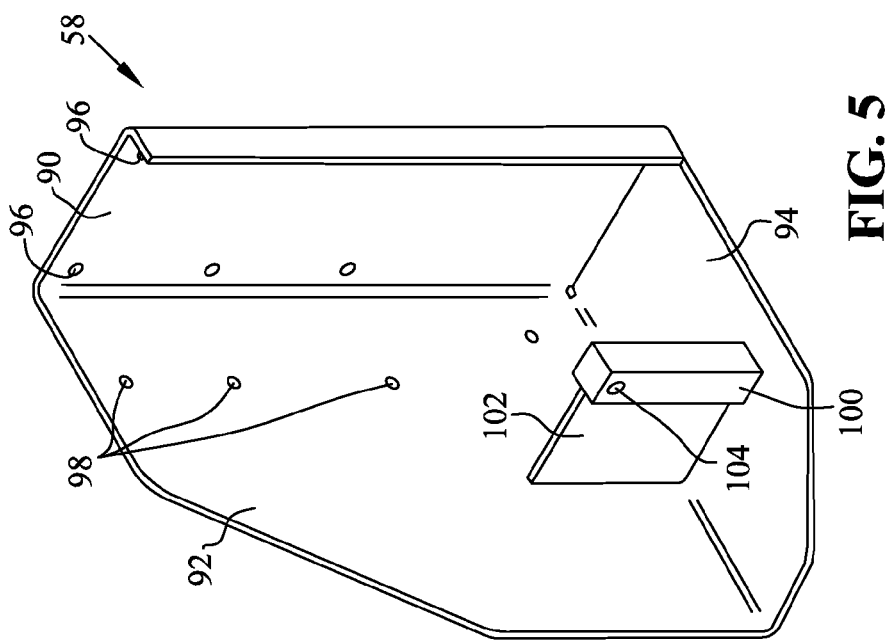
FIG. 6 shows the backup bracket for the pivot bracket shown in FIG. 5.

With respect to FIG. 6, backup bracket 60 includes a back wall 108 for attachment to shelter side wall 26 and a side wall 110 for placement against side wall 92 of bracket 58. Wall 108 includes apertures 112 for attachment to side wall 26 and wall 110 includes apertures 114 which match in template form with apertures 98 on wall 92 (FIG. 5), for attachment to side wall 92 of bracket 58.

Figure 7:
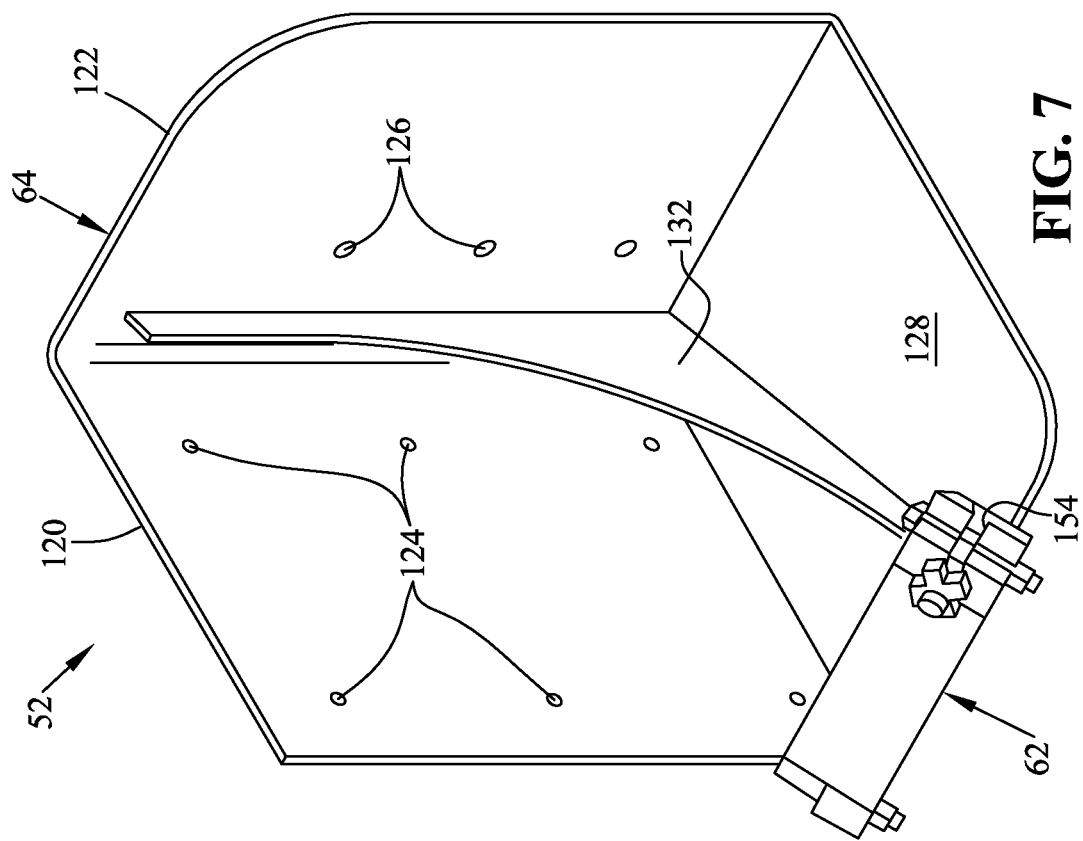
FIG. 7 shows a clamp assembly for attachment to a shelter and for retaining the mast in a stowed position.
Figure 10:
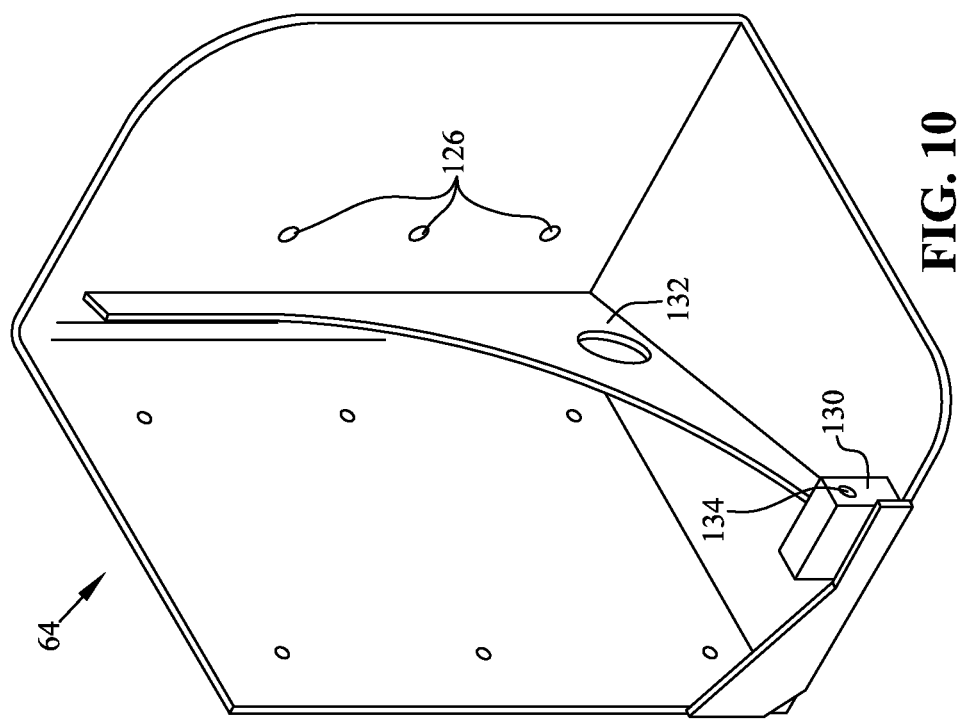
FIG. 10 shows the bracket member of the clamp assembly of FIG. 7.

With reference now to FIGS. 7-10, connection assembly 52 will be described. As shown in FIG. 7, bracket 64 includes back wall 120 and side wall 122. Back wall 120 has apertures 124 for attachment to side wall 26, whereas side wall 122 has apertures 126, for attachment to back-up bracket 66. Bracket 64 further includes a lower wall 128 which retains a pivot block 130 (FIG. 10) with a spacer rib 132 positioned between spacer block 130 and side wall 122. Spacer block 130 includes an aperture 134 extending therethrough for retaining clamp 62, as described herein.

With reference now to FIG. 9, clamp 62 is in the form of semi-cylindrical halves 140 and 142 where halve 140 includes pivot feet 144 which flank pivot block 130 (FIG. 9) having a fastener 146 extending therethrough. Meanwhile, clamp halves 140 and 142 are pivotally attached at side 148 and are clamped at side 150 by way of a swing bolt 152 which swings through a slot 154 (FIGS. 7 and 9) in the clamp halves 140, 142. It should be understood that swing bolt 152 includes a threaded star wheel 158, which when loosened, allows swing bolt 152 to rotate through slot 154, whereupon clamp halve 142 may pivot open about fastener 159.

Figure 11:
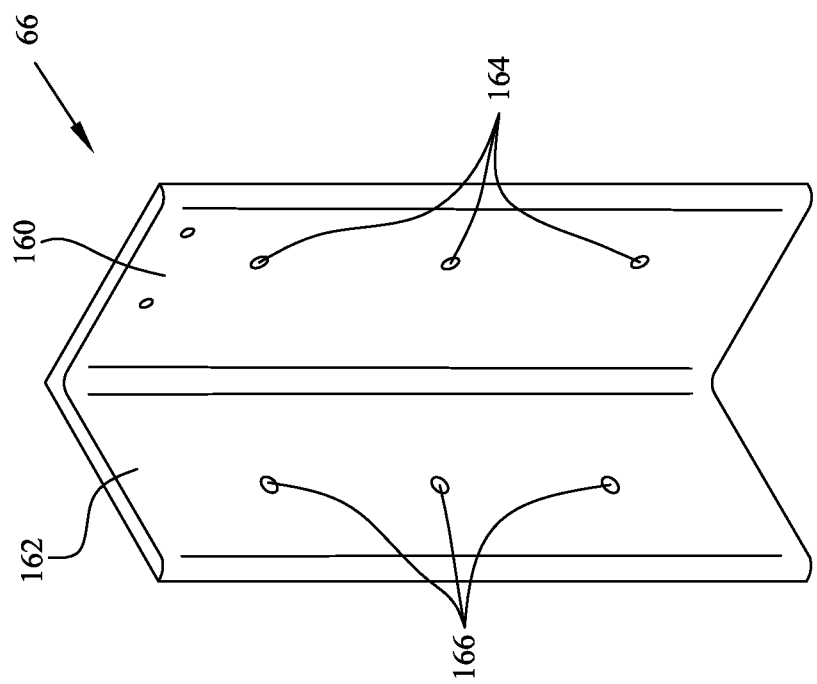
FIG. 11 shows a perspective view of the backup bracket for the clamp assembly of FIG. 7.

With reference now to FIG. 11, back-up bracket 66 is shown having plates 160, 162 having apertures 164,166 respectively, as more fully described below.

Figure 13:
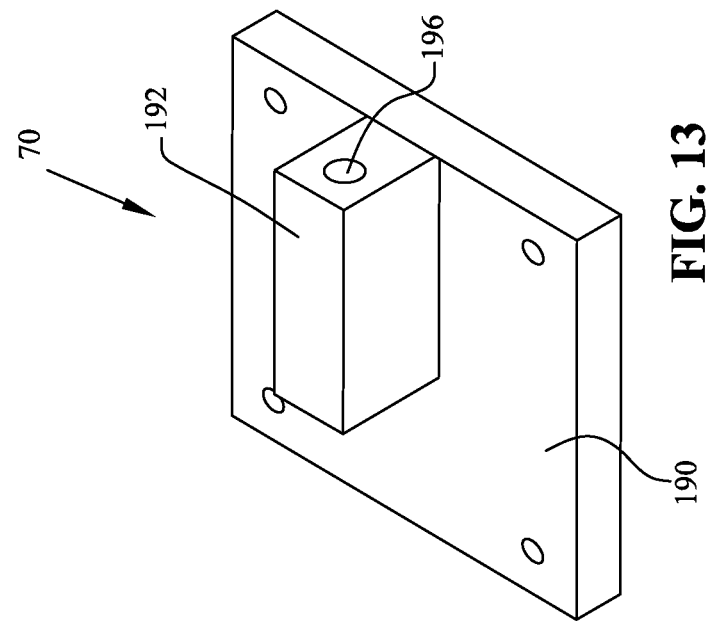
FIG. 13 shows the bracket portion of the clamp assembly of FIG. 12.
Figure 12:
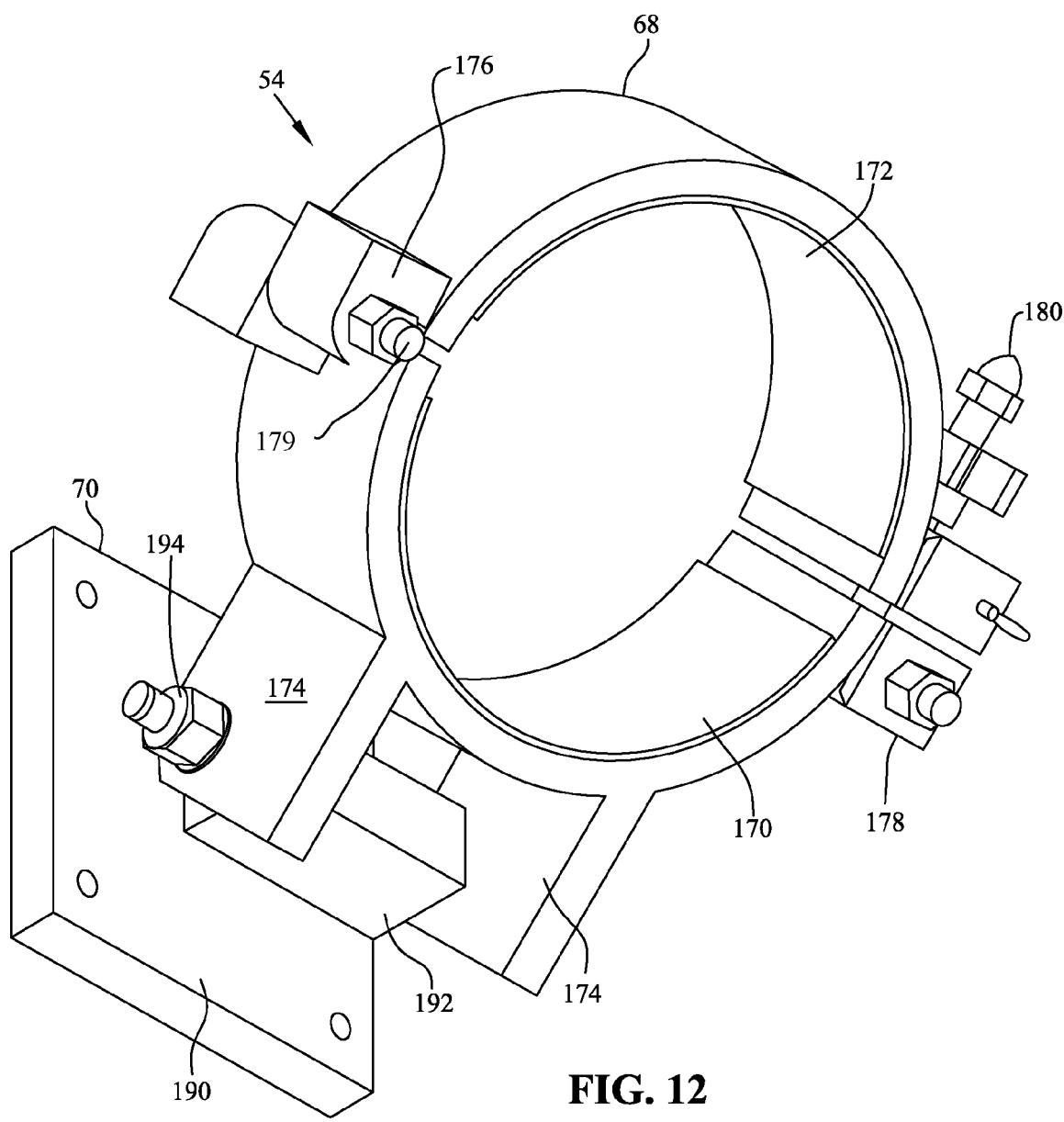
FIG. 12 shows a clamp assembly for attachment to a shelter and for retaining the mast in an erect position.

With reference now to FIGS. 12 and 13, clamp assembly 54 is shown having clamp halves 170 and 172 where clamp halve 170 includes pivot feet 174. Clamp halves 170 and 172 rotate about side 176 and lock about side 178 in a virtually identical manner as described above with respect to clamp 62. Thus, side 178 includes a swing bolt 180 which can be loosened to allow clamp halve 172 to rotate about side 176 and more particularly about fastener 179. Bracket 70 includes flange 190 for attachment to side wall 26 and a pivot block 192 for mounting pivot feet by way of fastener 194 through aperture 196 (FIG. 13).

As shown, mast 40 is telescopic, and includes a plurality of coaxially extendable sections 202 (FIG. 3). Mast could be of the type offered by The WILL-BURT Company of Orrville Ohio, as one of their quick erecting antenna masts (QEAM).

As described above, the mast assembly 18 is assembled by attaching bracket member 58 to sidewall 26 as shown in FIG. 3. Back-up bracket 60 is then attached to sidewall 26 and to bracket member 58. It should be understood that plate 92 (FIG. 5) would be positioned adjacent to plate 110 (FIG. 6) with apertures 98, 114 aligned. Fasteners could then be inserted to secure the bracket 58 and back-up bracket 60 together. Pivot mount member 56 is then attached to mast 40, and pivot mount member 56 is rotatably secured to bracket member 58 by way of a fastener 204 (FIG. 3). Connection assembly 52 may then be attached to sidewall 26 and to back-up bracket 66. As such, bracket 64 is positioned adjacent to sidewall 26 and fasteners are inserted through apertures 124 (FIG. 7). Back-up bracket 66 is then positioned with plate 160 against sidewall 26 and plate 162 adjacent to wall 122, with apertures 166 (FIG. 11) aligned with apertures 126 (FIG. 7). Finally, connection assembly 54 is attached to sidewall 26 with bracket 70 attached to sidewall 26.

To stow the mast 40, mast 40 is positioned in FIG. 3, with clamp halves 140, 142 encompassing the mast 40, and with swing bolt 152 (FIG. 9) in the locked position. As shown in the stowed position of FIG. 3, mast is confined within the envelope of the sidewall 26, that is, it extends diagonally from corner to corner, but between front wall 24, rear wall 30, top wall 22, and lower edge 25. In this configuration, the vehicle 10 can be maneuvered from place to place with mast 40 in the stowed position. Vehicle 10 may also be loaded onto transport vehicles such as cargo planes as the mast in the stowed position is lower than the top wall 22 of the vehicle.

Figure 14:
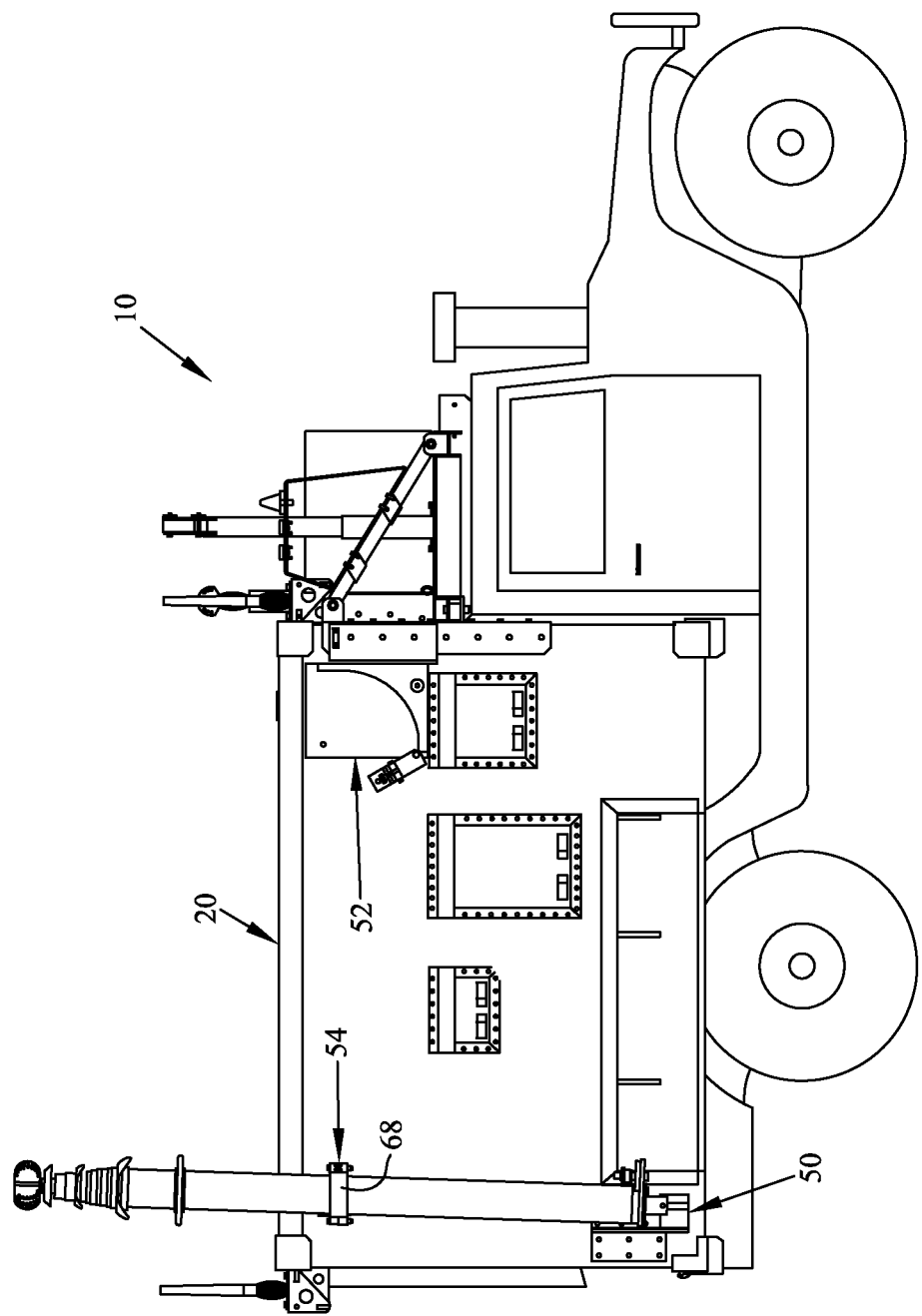
FIG. 14 is a view similar to that of FIG. 1, showing the mast in a second position, erect position, prior to the telescopic extension.

When the vehicle arrives at a site where the antenna needs to be erected, clamp 62 is released and mast 40 is rotated counterclockwise (as viewed in FIG. 14) to clamp 68. Clamp halves 170 and 172 are then positioned around mast 40, and swing bolt 170 is locked to tighten clamp member around mast 40. Mast 40 may then be erected according to the mast specifications, for example, by jack screw or pneumatic activation.

Figure 15:
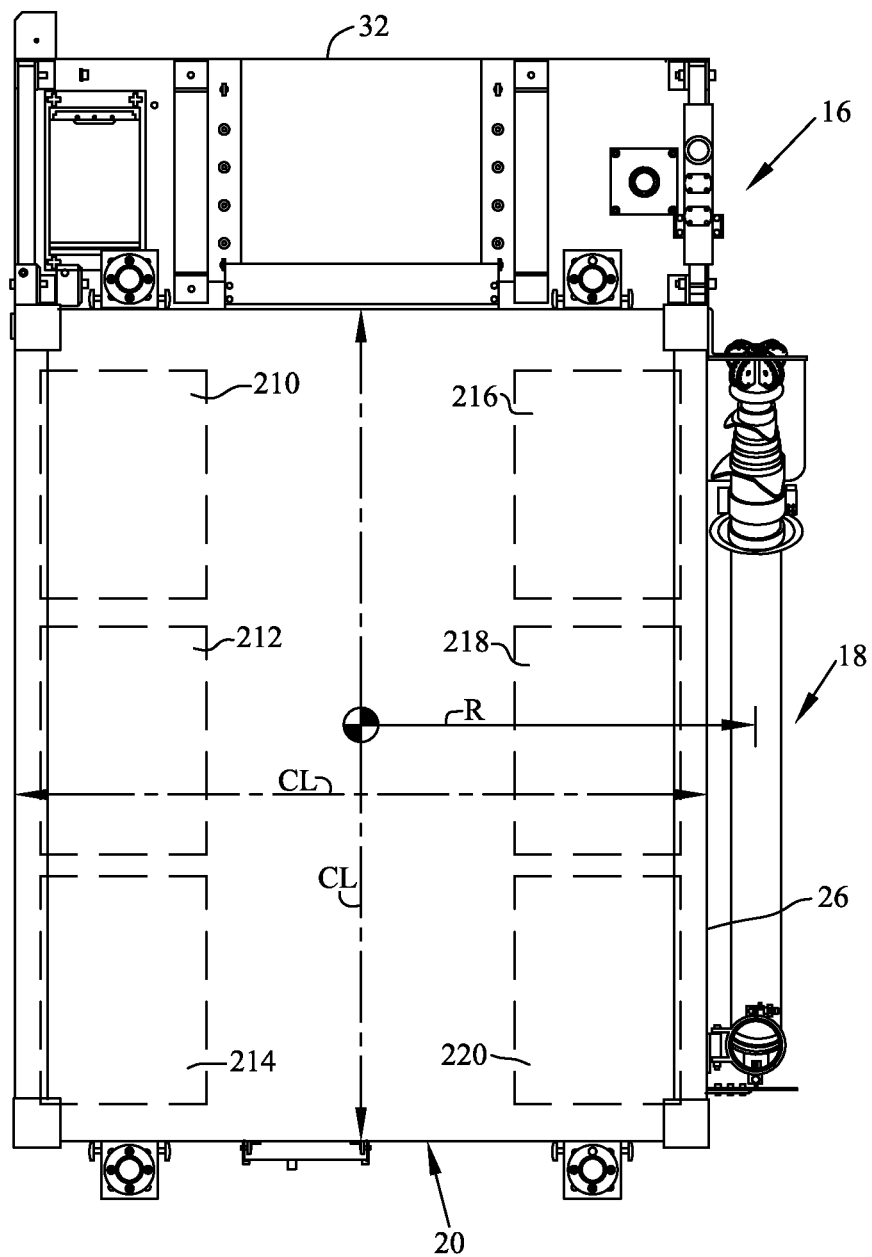
FIG. 15 shows up an upper plan view of the shelter with the internal equipment shown diagrammatically.

With reference to FIG. 15, mast assembly 18 extends outwardly from sidewall 26, and extends a distance "R" from the lateral centerline of the shelter 20. The shelter includes electronic equipment, for example radio transmission equipment. This equipment could be mounted to the inside of the shelter walls, or could be provided on electronic racks. This equipment is shown diagrammatically, as items 210-220 in FIG. 15. This equipment is arranged for its weight distribution, such that the center of gravity is laterally and longitudinally centered with the shelter, as shown in FIG. 15. Said differently, the location of items 210-220 is such as to compensate for the offset mass position of the mast assembly 18.

It should be appreciated from the disclosure that the elements of the pivot connection assembly 50, first connection assembly 52 and second connection assembly 54 are constructed of suitable materials for the application, and as shown are steel members, such as steel plate, steel channels, steel tubes, etc. However these items could be comprised of any alloys or composites suitable for the use as described. The connection of the various members is done by a typical connection technology such as welding, but fasteners, bonding etc. could also be employed. The pivot connection assembly 50, first connection assembly 52 and second connection assembly 54 are also described as held to the shelter enclosure 20 by way of fasteners, but it should be appreciated that the bracket members could be fixed to the shelter by way of welding or other suitable fastening techniques. In addition some of the components, such as the brackets themselves could be integrated into the shelter sidewall 26 altogether. These and other variants should be appreciated readily to one skilled in the art.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method of making a transportable mast, comprising the steps of:
    providing a mast with a first pivoting mount on a first end section of said mast;
    pivotally mounting said pivoting mount that attaches said mast to a sidewall of a vehicle;
    providing a first connection assembly for retention of the mast in a stowed position; and
    providing a second connection assembly for retention of the mast in an erect position;
    wherein said first and second connection assemblies attach to said mast in another section of said mast other than said first section; the first pivoting mount being configured to allow the mast to pivot from the stowed position to the erect position; and wherein the step of providing the first and second connection assemblies comprises attaching first and second clamp assemblies to the sidewall of the vehicle.

2. The method of claim 1, wherein the first clamp assembly is attached to the vehicle sidewall such that the mast is stowed diagonally across the sidewall.

3. The method of claim 2, wherein the second clamp assembly is attached to the vehicle sidewall such that the mast is erected vertically relative to the sidewall.

4. The method of claim 1, wherein said first and second connection assemblies comprise a first section, a second section, a coupling section adapted to couple one end of each of said first and second structures, and a compression structure operable to couple an opposing end of said first and second structures in a clamping position around said mast in closed configuration and selectively releasing said mast by disengaging said first and second sections in an open configuration.

5. The method of claim 4, wherein said compression structure comprises a threaded swing bolt with a nut, wherein said nut has a surface or flanges operable to permit application of force to said nut comprising manual tightening and loosening of said nut.

6. The method of claim 5, wherein said nut is a star wheel.

7. The method of claim 4, wherein said first and second structures comprise clamp halves.

8. The method of claim 1, wherein said mast comprises a telescopic mast including extendable sections.

9. The method of claim 1, wherein said first pivoting mount comprises a first plate section attached to said sidewall and a second plate section extending away from said first plate section, wherein said pivoting mount attaches to said second plate section.

10. The method of claim 1, wherein said first connection assembly comprises a first side, a second side, and a third side, wherein said first side couples to said sidewall of said vehicle, said second side extends away from said first side on a first edge section of said first side, said third side extends way from said first side on a second edge section of said first side.

11. The method of claim 10, wherein said first connection assembly further comprises a rib section adapted to couple said second and third sides, said rib section if positioned at an angle to said first side.

12. The method of claim 11, wherein said rib section is formed so as to permit said mast to be received by said first connection assembly without said rib section physically touching said mast when said first connection assembly retains said mast in said stowed position.

13. The method of claim 1, wherein said first connection assembly comprises first selectively releasable clamp operable to selectively retain or release said mast and a first, second, and third sides, wherein said first side couples with said sidewall, said second side couples a first edge section of said first wall, and said third side couples with a second edge section of said first wall, wherein said second and third walls coupled with each other on another set of edges, said first selectively releasable clamp couples with said second wall.

\* \* \* \* \*